(12) United States Patent
Jensen et al.

(10) Patent No.: US 6,781,434 B2
(45) Date of Patent: Aug. 24, 2004

(54) LOW CHARGE-DUMP TRANSISTOR SWITCH

(75) Inventors: Richard S. Jensen, Aloha, OR (US); David S. Dunning, Portland, OR (US); Michael M. DeSmith, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/247,752

(22) Filed: Sep. 19, 2002

(65) Prior Publication Data

US 2003/0098722 A1 May 29, 2003

Related U.S. Application Data

(63) Continuation-in-part of application No. 09/750,579, filed on Dec. 28, 2000, now abandoned.

(51) Int. Cl.[7] .............................................. H03K 17/30
(52) U.S. Cl. ...................................................... 327/382
(58) Field of Search ................................ 327/379, 382, 327/403, 404, 427

(56) References Cited

U.S. PATENT DOCUMENTS

| | | | | |
|---|---|---|---|---|
| 4,198,580 A | * | 4/1980 | Culmer .......................... 327/389 |
| 4,393,318 A | * | 7/1983 | Takahashi et al. ............ 327/94 |
| 4,467,227 A | | 8/1984 | Lewyn et al. ................. 307/577 |
| 4,651,037 A | * | 3/1987 | Ogasawara et al. .......... 327/389 |
| 4,862,016 A | | 8/1989 | Genrich ........................ 307/353 |
| 4,988,902 A | * | 1/1991 | Dingwall ....................... 327/382 |
| 5,019,731 A | * | 5/1991 | Kobayashi .................... 327/434 |
| 5,148,054 A | * | 9/1992 | Demler ......................... 327/91 |
| 5,479,121 A | | 12/1995 | Shen et al. .................... 327/94 |
| 5,534,815 A | * | 7/1996 | Badyal .......................... 327/437 |
| 6,075,400 A | * | 6/2000 | Wu et al. ...................... 327/382 |
| 6,124,739 A | | 9/2000 | Roither et al. ............... 327/100 |
| 6,522,187 B1 | * | 2/2003 | Sousa ............................ 327/391 |

OTHER PUBLICATIONS

Eichenberger, C., et al., "Dummy Transistor Compensation of Analog MOS Switches", *IEEE Transactions of Solid-State Circuits*, 24 (4), (Aug. 1989), pp. 1143–1146.

Eichenberger, C., et al., "On Charge Injection in Analog MOS Switches and Dummy Switch Compensation Techniques", *IEEE Transactions on Circuits and Systems, 37* (2), (Feb. 1990), pp. 256–264.

* cited by examiner

*Primary Examiner*—Jeffrey Zweizig
(74) *Attorney, Agent, or Firm*—Schwegman, Lundberg, Woessner & Kluth, P.A.

(57) ABSTRACT

A switch circuit having low charge dumping characteristics includes multiple parallel connected switching transistors and one or more associated cancellation transistors. The switching transistors perform basic switching functions within the switch circuit in response to a digital signal. During transitions of the digital signal, the switching transistors dump charge on an output node thereof due to parasitic capacitances within the devices. The cancellation transistor(s) dumps charge of an opposite polarity on the output node to cancel the charge dumped by the switching transistors. Two switching transistors are used for each cancellation transistor so that equal sized devices can be used throughout the switch circuit.

10 Claims, 4 Drawing Sheets

LOW CHARGE-DUMP TRANSISTOR SWITCH

This is a continuation-in-part of application Ser. No. 09/750,579, filed Dec. 28, 2000, now abandoned.

FIELD OF THE INVENTION

The invention relates generally to transistor switches and, more particularly, to techniques and structures for reducing transient charge effects therein.

BACKGROUND OF THE INVENTION

Integrated circuits commonly use insulated gate field effect transistors (IGFETs) as switching gates to controllably couple circuit nodes within the circuitry. One type of IGFET that is regularly used in this regard is, for example, the metal-oxide-semiconductor field effect transistor (MOSFET). A control voltage is typically applied to the gate terminal of the IGFET switch to change an impedance between the source and drain terminals thereof in a predetermined manner. When one voltage level is applied to the gate terminal of the IGFET switch, a low impedance condition (e.g., a short circuit) results between the source and drain terminals of the device that will conductively couple circuit nodes attached thereto. When a different voltage level is applied to the gate terminal, a high impedance condition (e.g., an open circuit) results between the source and drain terminals of the device to electrically isolate the circuit nodes coupled to these terminals. Other switching configurations, including those involving multiple transistors, are also commonly used.

As is well known, IGFET devices typically include internal parasitic capacitances that are caused by a physical overlap of the gate of the device with the source and the drain regions thereof. These "overlap" capacitances appear as series capacitors between the gate terminal and the source and drain terminals of the device. The gate-drain overlap capacitance is commonly referred to as the Miller capacitance of the device and will typically appear twice as large as it actually is. When the voltage on the gate terminal of an IGFET switch is varied during circuit operation, the overlap capacitances within the device charge and discharge in a corresponding manner. This charging and discharging of the overlap capacitances will often generate narrow spikes on the source and drain terminals of the IGFET switch due to "charge dumping" from the overlap capacitances. These spikes can cause glitches within the associated circuitry that can negatively impact the operation thereof. Therefore, it is important that charge dumping be kept low in such switches. As the physical size of circuits gets smaller, however, it is anticipated that the relative size of the overlap capacitances within transistor switches will increase.

DETAILED DESCRIPTION

Figure 1:
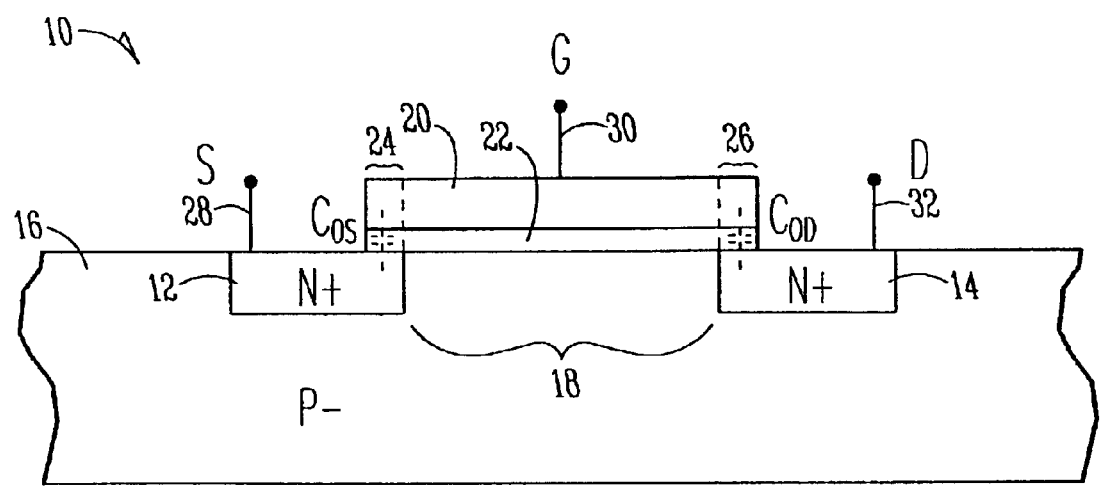
FIG. 1 is a simplified side view illustrating a conventional N-channel enhancement IGFET.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to transistor switch circuits that generate reduced levels of dumped charge during switching operations. Two or more "switching" transistors are connected in parallel within the switch circuit to perform basic switching functions in response to a digital control signal. During a switching operation, the switching transistors dump charge at a circuit node within the switch circuit based on the action of parasitic overlap capacitances (e.g., the Miller capacitance) within the switching transistors. One or more "cancellation" transistors are employed within the switch circuit to dump charge of an opposite polarity (e.g., negative charge rather than positive charge) onto the circuit node at approximately the same time to reduce or eliminate the effects of the charge dumped by the switching transistors. The number of cancellation transistors connected to the circuit node is one-half the number of switching transistors. In this manner, the switch circuit can be implemented using switching transistors and cancellation transistors that are substantially equal in size. The transistor switch circuits can be beneficially implemented within a wide variety of different integrated circuit types. The switch circuits are particularly valuable in systems that require accurate switching of analog voltages, such as in circuits using comparators and/or operational amplifiers. The principles of the present invention are particularly well suited for implementation within circuits utilizing complementary metal-oxide-semiconductor (CMOS) technology. Significantly, the principles of the present invention may be used to counteract the effects of Miller capacitance within integrated circuit switches.

FIG. 1 is a simplified side view illustrating an N-channel enhancement IGFET 10 that can be used to provide switching functionality within an integrated circuit. As illustrated, the IGFET 10 includes heavily N-doped source and drain regions 12, 14 within a P-doped semiconductor substrate 16. The source and drain regions 12, 14 define a channel region 18 within the substrate 16. A conductive gate member 20 lies above the channel region 18 of the substrate 16 and is separated from the substrate 16 by a thin insulating layer 22. Conductive terminals 28, 30, 32 are connected to the source region 12, the drain region 14, and the gate member 20 of the IGFET 10 to provide for circuit connection of these structures. As is well known in the art, the source and drain terminals of an IGFET device are often interchangeable.

Therefore, as used herein, these terms are not meant to be limiting with respect to one another.

With no voltage applied to the gate terminal 30 of the IGFET 10, a relatively large impedance exists between the source and drain regions 12, 14 of the device. When a positive voltage having the requisite size is applied to the gate terminal 30, however, a channel of minority carriers (i.e., electrons in an N-channel device) forms in the channel region 18 that results in a relatively low impedance between the source and drain regions 12, 14 of the device. To form the channel, a voltage exceeding the threshold voltage (VT) of the IGFET must be applied to the gate terminal 30. The above described characteristics allow the N-channel enhancement IGFET 10 to be used as a voltage controlled switch in circuit applications. In a similar manner, P-channel enhancement IGFETs and N-channel and P-channel depletion IGFETs (i.e., devices having pre-formed channels), as well as other transistor types, can also be used as voltage controlled switches. One form of IGFET that is commonly employed is the metal-oxide-semiconductor field effect transistor (MOSFET), although other types also exist.

As illustrated in FIG. 1, there will typically be some physical overlap 24, 26 between the gate member 20 and the source and drain regions 12, 14 of an IGFET device. This overlap 24, 26 produces parasitic capacitances within the device (i.e., $C_{OS}$ and $C_{OD}$) that can effect the operation thereof. As the voltage on the gate 20 of the transistor 10 is varied, the amount of charge stored within these parasitic "overlap" capacitances will vary in a corresponding manner. If the gate voltage is changed suddenly, such as during the rising or falling edge of an input pulse, charge will typically be dumped from the overlap capacitances onto the corresponding output nodes of the IGFET 10 (i.e., the source and drain terminals 28, 32). For example, when the gate voltage of the IGFET 10 is changed suddenly from zero volts to a positive voltage, positive charge is dumped at the source and drains terminals 28, 32 of the IGFET 10 by the action of the overlap capacitors $C_{OS}$ and $C_{OD}$. In a similar fashion, when the gate voltage is changed suddenly from a positive voltage to zero volts, negative charge is dumped at the source and drain terminals 28, 32 by the action of the overlap capacitors $C_{OS}$ and $C_{OD}$. As can be appreciated, this charge dumping can produce glitches within the associated circuitry that can have a negative impact on the operation thereof.

Figure 2:
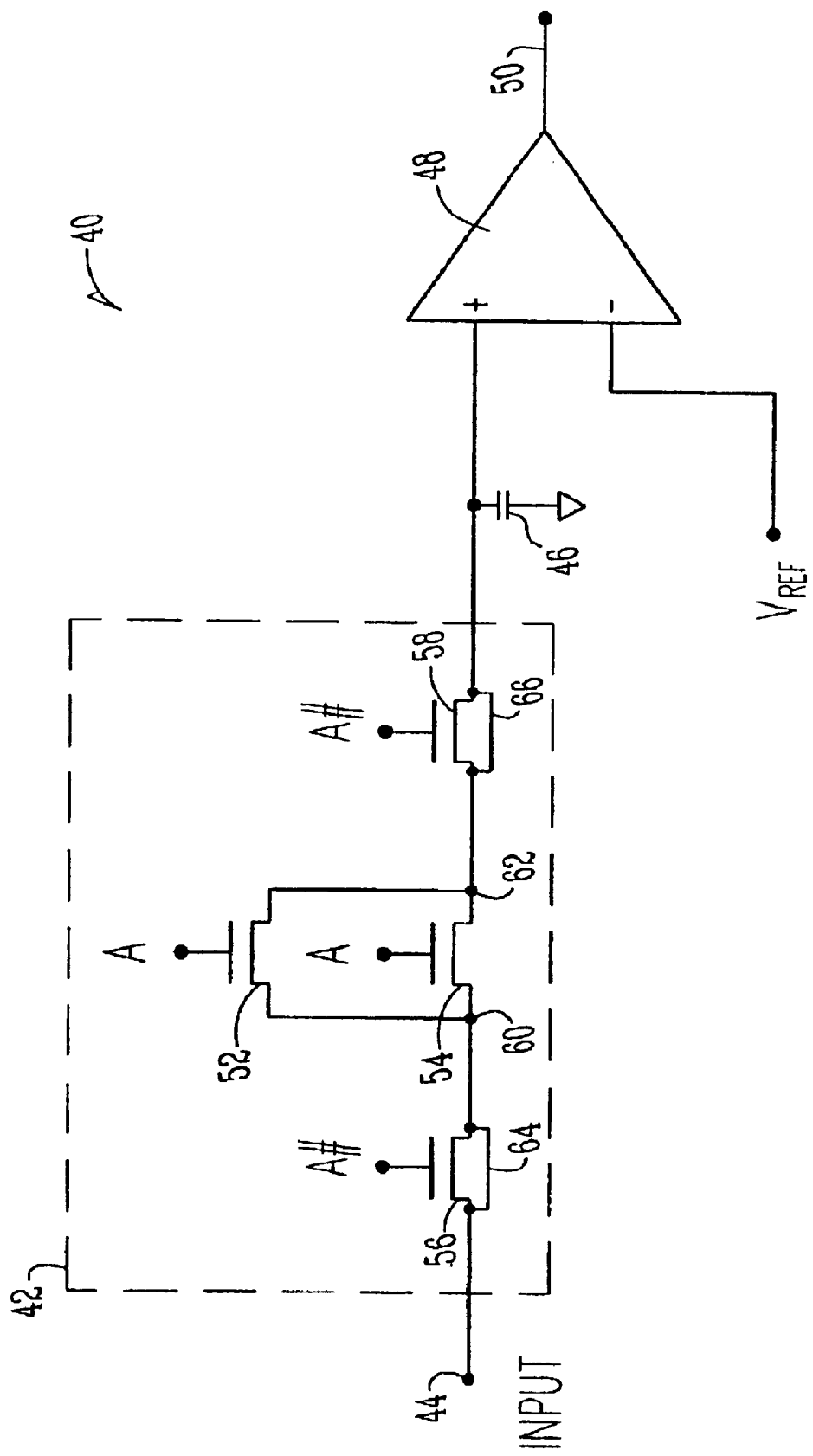
FIG. 2 is a schematic diagram illustrating a sample and hold system utilizing a transistor switch circuit in accordance with one embodiment of the present invention.

FIG. 2 is a schematic diagram illustrating a sample and hold system 40 in accordance with one embodiment of the present invention. As illustrated, the sample and hold system 40 includes: an input terminal 44, an output terminal 50, a transistor switch circuit 42, a capacitor 46, and a comparator 48. The sample and hold system 40 is operative for periodically sampling the value of an analog input voltage on the input terminal 44 and holding each sampled value for a predetermined period on the output terminal 50 before a next sample is taken. The sampled values can then be converted to digital values using a digital to analog converter (not shown) coupled to the output terminal 50. The transistor switch circuit 42 is operative for controllably coupling the input terminal 44 of the sample and hold system 40 to one terminal of the capacitor 46. The switch circuit 42 receives a digital control signal A to control the switching function. The other terminal of the capacitor 46 is grounded. The comparator 48 provides a high input impedance buffer between the capacitor 46 and the output terminal 50. The comparator 48 will typically be configured as a unity gain buffer to translate the capacitor voltage to the output terminal 50.

When the switch circuit 42 is gated on (i.e., the digital control signal A is logic high), a low resistance path is established between the input terminal 44 and the capacitor 46. As a result, the voltage across the capacitor 46 will follow the analog input voltage on the input terminal 44. When the switch circuit 42 is subsequently gated off (i.e., the digital control signal A changes to logic low), the voltage on the capacitor 68 will thereafter stay relatively constant (due to, for example, the high input impedance of the comparator 48). When the switch circuit 42 is again gated on and then off, the capacitor 46 will again assume the voltage of the analog input signal and hold that voltage. The process will typically be repeated at regular sampling intervals. The resulting capacitor voltage levels will be translated to the output terminal 50 via the comparator 48.

With reference to FIG. 2, if the switch circuit 42 were to dump charge at an output node 68 thereof each time the control signal A changed state, potentially harmful errors could result in the voltage across the capacitor 46. These errors would then translate to the output terminal 50 of the sample and hold system 40. For this reason, in accordance with the present invention, a transistor switch circuit 42 is provided that generates a reduced level of dumped charge during switching operations. As illustrated, the transistor switch circuit 42 includes first and second switching transistors 52, 54 and first and second cancellation transistors 56, 58. The first and second switching transistors 52, 54 perform the switching functions of the switch circuit 42. As will be described in greater detail, the first and second cancellation transistors 56, 58 are operative for reducing or eliminating the external effects of charge dumping within the switch circuit 42. In the illustrated embodiment, the first and second switching transistors 52, 54 and the first and second cancellation transistors 56, 58 are each N-channel IGFET devices. It should be appreciated, however, that other types of transistors can alternatively be used.

As illustrated in FIG. 2, the first and second switching transistors 52, 54 are connected in a parallel arrangement between first and second circuit nodes 60, 62. That is, one source/drain terminal of each switching transistor 52, 54 is connected to the first circuit node 60 and the other source/drain terminal of each switching transistor 52, 54 is connected to the second circuit node 62. The first cancellation transistor 56 is connected between the input terminal 44 of the switch circuit 42 and the first circuit node 60. The second cancellation transistor 58 is connected between the second circuit node 62 and the output node 68 of the switch circuit 42. The two output terminals (i.e., the source/drain terminals) of the first cancellation transistor 56 are shorted together using a shorting element 64 (e.g., a metal net on die). Similarly, the two output terminals of the second cancellation transistor 58 are shorted together using a shorting element 66. Therefore, the input terminal 44 is conductively coupled to the first circuit node 60 through the first shorting element 64 and the output node 68 is conductively coupled to the second circuit node 62 through the second shorting element 66. As illustrated, the cancellation transistors 56, 58 each receive an inverted version of the digital control signal A (i.e., A#) at corresponding gate terminals. Thus, when the control signal A is transitioning in one direction (e.g., from logic high to logic low), the inverted signal A# will be transitioning in the opposite direction (e.g., from logic low to logic high). Methods for generating inverted signals are well known in the art. In a preferred approach, the digital control signals A and A# will be derived from a dual phase clock. Other approaches, including techniques utilizing digital inverters and/or delay units, can also be used.

When the gate voltages of the switching transistors 52, 54 are above $V_T$ (e.g., the digital control signal A is logic high), the transistors 52, 54 are turned "on" and the first and second circuit nodes 60, 62 are conductively coupled to one another. As described above, this conductively couples the input terminal 44 of the sample and hold system 40 to the capacitor 46 and, as a result, the voltage on the capacitor 46 assumes the value of the analog input voltage. When the gate voltages of the switching transistors 52, 54 are below VT (e.g., the digital control signal A is logic low), the input terminal 44 is electrically isolated from the capacitor 46 which holds its present voltage value. As described previously, when the digital control signal A transitions between voltage values (e.g., from logic high to logic low, or vice versa), charge is dumped from the overlap capacitors within the switching transistors 52, 54 onto the corresponding circuit nodes 60, 62. In the same manner, when the inverted control signal A# transitions between voltage values, charge is dumped from the overlap capacitors within the cancellation transistors 56, 58 onto the corresponding circuit nodes 60, 62. However, because the cancellation transistors 56, 58 receive an inverted version of the digital control signal A, the charge dumped by the cancellation transistors 56, 58 is opposite in polarity to the charge dumped by the switching transistors 52, 54. Therefore, charge cancellation takes place at circuit nodes 60, 62. Because the output terminals of the first cancellation transistor 56 are shorted together, all of the charge dumped by this transistor 56 during a single transition of the inverted control signal A# will occur on the first circuit node 60. In a similar manner, all of the charge dumped by the second cancellation transistor 58 at this time will occur on the second circuit node 62.

In accordance with one aspect of the present invention, the first and second switching transistors 52, 54 and the first and second cancellation transistors 56, 58 are each approximately the same size. Therefore, the overlap capacitances within the devices will each be approximately the same size and will each dump an approximately equal amount of charge. Because output terminals of two switching transistors 52, 54 are connected to circuit node 60, the amount of charge dumped on this node 60 by the two switching transistors 52, 54 (from the two corresponding overlap capacitors) will be approximately equal to the amount of charge dumped by the first cancellation transistor 56 (also from two overlap capacitors). Similarly, the amount of charge dumped on the second circuit node 62 by the two switching transistors 52, 54 (from the two corresponding overlap capacitors) will be approximately equal to the amount of charge dumped by the second cancellation transistor 58 (also from two overlap capacitors). In this manner, a high level of charge cancellation is achieved. In a preferred approach, an enhanced level of cancellation is achieved by using closely matched devices for the first and second switching transistors 52, 54 and the first and second cancellation transistors 56, 58.

In a prior charge cancellation scheme, a cancellation transistor having approximately one-half the size of a corresponding switching transistor was used to provide charge cancellation within a switch. As the physical size of integrated circuits gets smaller over time, however, it becomes increasingly difficult to accurately achieve half-size devices for use in such switches. In accordance with the present invention, high levels of charge cancellation can be achieved utilizing transistors having approximately the same size. In the illustrated embodiment, a single cancellation transistor is used to cancel charge dumped on a circuit node by two equal sized, parallel connected switching transistors. It should be appreciated that further equal sized, parallel connected switching transistors and cancellation transistors can be added to the switch circuit as long as a two to one ratio between switching transistors and cancellation transistors is maintained. For example, in one embodiment, two equal sized, parallel connected cancellation transistors are used to cancel charge dumped on a circuit node by four equal sized, parallel connected switching transistors.

Figure 3:
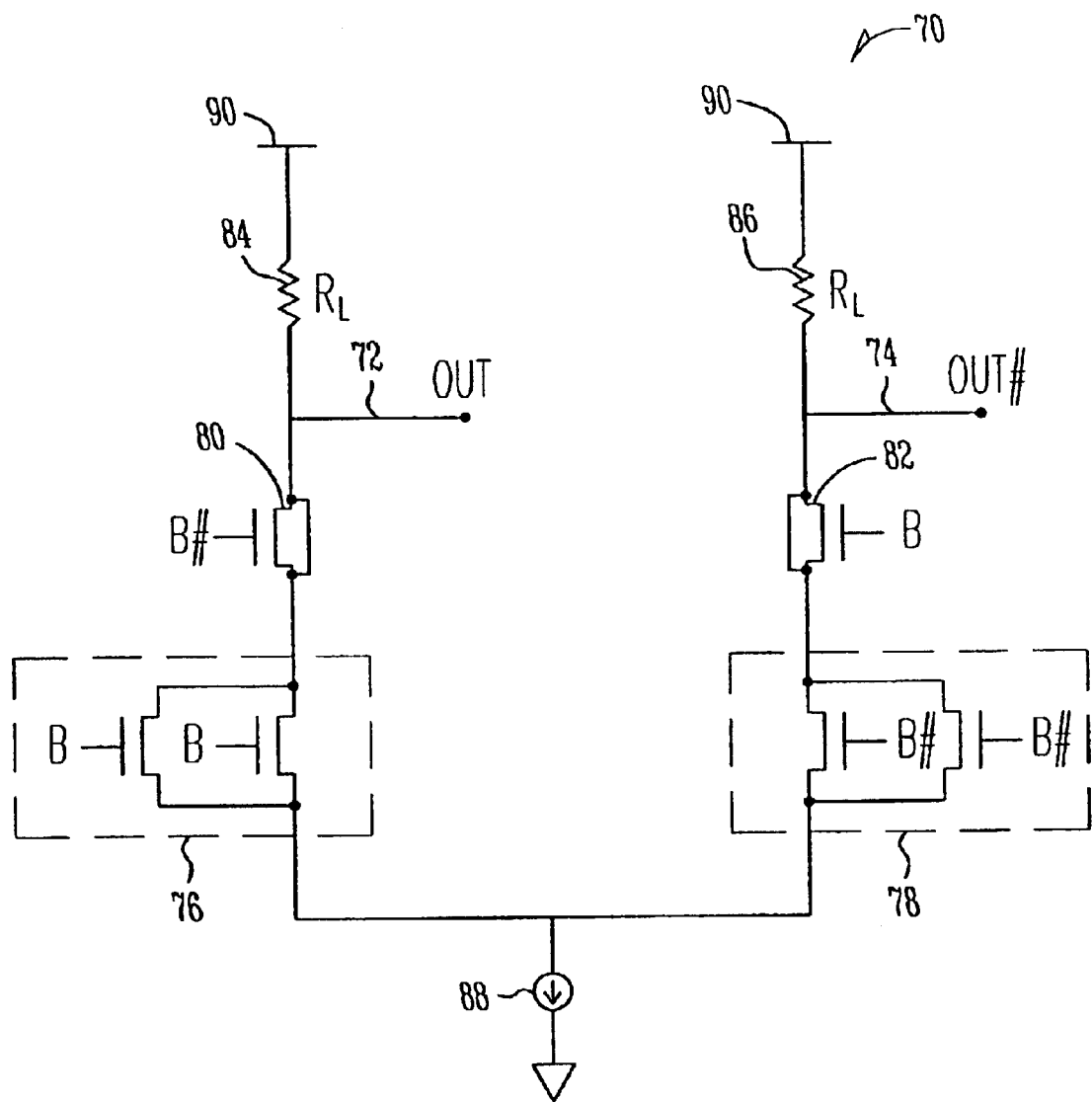
FIG. 3 is a schematic diagram illustrating a driver circuit in accordance with one embodiment of the present invention.

It should be appreciated that the principles of the present invention can be advantageously implemented within circuits other than sample and hold systems. For example, FIG. 3 is a schematic diagram illustrating a driver circuit 70 in accordance with one embodiment of the present invention. The driver circuit 70 can be used, for example, to drive a digital transmission medium coupling two chips in a computer system. As illustrated, the driver circuit 70 includes: a first pair of parallel connected switching transistors 76; a second pair of parallel connected switching transistors 78; first and second cancellation transistors 80, 82; first and second load resistors 84, 86; first and second differential output lines 72, 74; and a current source 88. In accordance with the present invention, each of the transistors within the first pair of switching transistors 76 and the second pair of switching transistors 78, as well as the first and second cancellation transistors 80, 82, are approximately the same size. Preferably, all of these transistors will be closely matched to one another. As before, the two source/drain terminals of the first cancellation transistor 80 and the two source/drain terminals of the second cancellation transistor 82 are shorted together using shorting elements. The driver circuit 70 drives the two differential output lines 72, 74 based on a digital input signal B.

The first pair of switching transistors 76 receive the digital input signal B at corresponding gate terminals. The second pair of switching transistors 78 receive an inverted version of the digital input signal B (i.e., B#) at their gate terminals. When the digital input signal B is logic high, the first pair of switching transistors 76 turn on. This allows the current source 88 to draw a current from a supply terminal 90 through the first load resistor 84, the shorting element of the first cancellation transistor 80, and the first pair of switching transistors 76. A current component will also be drawn from the first differential output line 72. The resulting voltage drop across the first load resistor 84 causes a low voltage value on the first differential output terminal 72. At the same time, the inverted signal B# will be logic low and the second pair of switching transistors 78 will be off. Thus, the full supply voltage from supply terminal 90 will appear on the second differential output terminal 74. When the digital input signal B transitions to logic low, the second pair of switching transistors 78 turn on and the first pair of switching transistors 76 turn off. Thus, the full supply voltage appears on the first differential output line 72 and the low voltage value appears on the second differential output line 74. In this manner, a digital output signal is transmitted to a remote location via the first and second differential output lines 72, 74.

As shown in FIG. 3, the second cancellation transistor 82 receives the digital input signal B at the gate terminal thereof and the first cancellation transistor 80 receives the inverted input signal B# at the gate terminal thereof. Therefore, during a transition of the digital input signal B, the charge dumped by the first cancellation transistor 80 will cancel charge dumped by the first pair of switching transistors 76 and the charge dumped by the second cancellation transistor 82 will cancel charge dumped by the second pair of switching transistors 78. In this manner, the inventive principles can be used to prevent charge buildup and/or glitches on the differential output lines 72, 74 that could otherwise cause jitter or other transmission problems. As before, because the transistors within the driver circuit 70 are all the same size, design and fabrication is simplified.

Figure 4:
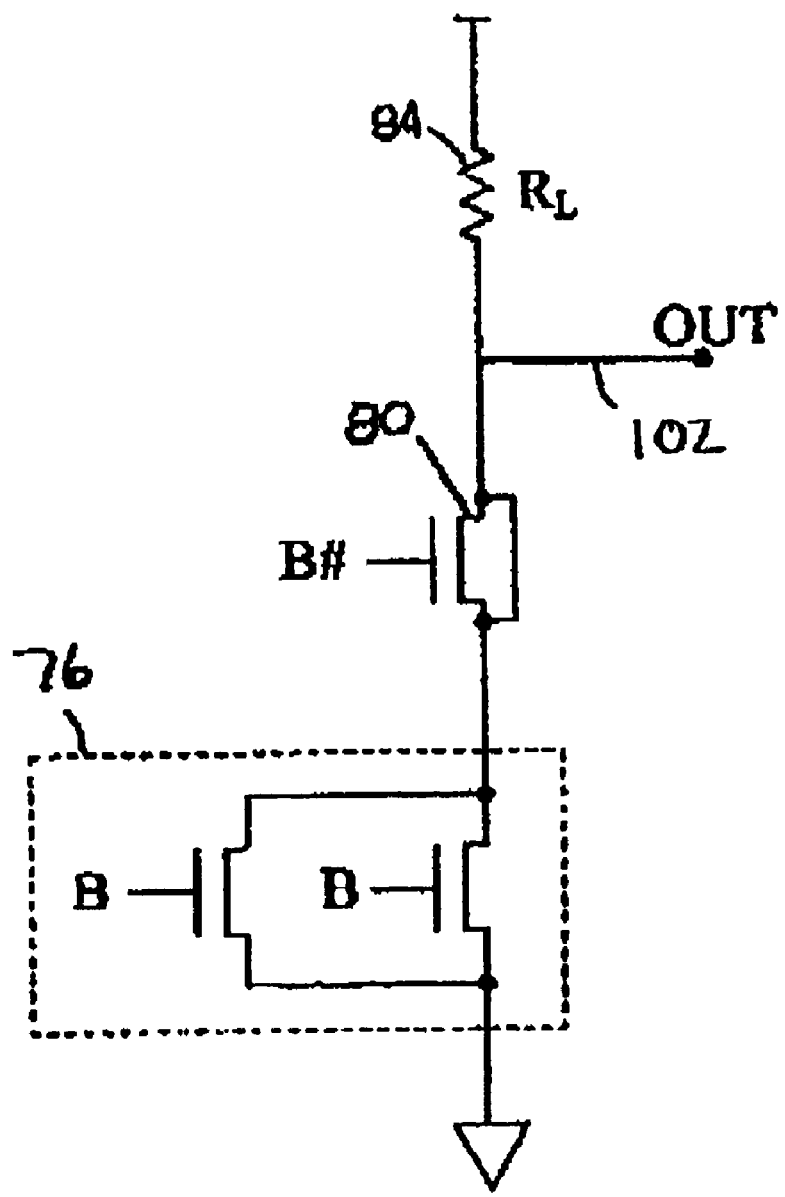
FIG. 4 is a schematic diagram illustrating a driver circuit in accordance with another embodiment of the present invention.

FIG. 4 is a schematic diagram illustrating a driver circuit 92 in accordance with an embodiment of the present invention. The driver circuit 92 is a single-ended version of the differential driver circuit 70 of FIG. 3. As illustrated, the driver circuit 92 includes: a pair of parallel connected switching transistors 76, a cancellation transistor 80, a resistor 84, and an output line 102. The transistors 76, 80 are all the same size. When a digital input signal B is logic high, the switching transistors 76 turn on. This couples the output line 102 to ground resulting in a logic low value on the output line 102. When the digital input signal B transitions to logic low, the switching transistors 76 turn off resulting in a logic high value on the output line 102. In this manner, a digital output signal is transmitted to a remote location via the output line 102. The cancellation transistor 80 performs charge cancellation as described previously.

As will be appreciated by persons of ordinary skill in the art, alternative schemes for interconnecting multiple switching transistors with one or more equal sized cancellation transistors to achieve charge cancellation can be implemented in accordance with the present invention. Charge cancellation can be performed at both output terminals of each switching transistor or at only a single output terminal. Switches implementing the inventive principles can be used in a wide range of circuit applications requiring low noise generation.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A driver circuit to drive a digital transmission medium, comprising:
   an output terminal to connect said driver circuit to the digital transmission medium; and
   a switch circuit to controllably couple said output terminal to a ground node in response to a digital input signal, said output terminal being held at a supply voltage when not coupled to said ground node by said switch circuit, said switch circuit including:
      at least two switching transistors each having an input terminal and first and second output terminals, said first output terminal of each of said at least two switching transistors being connected to a first circuit node and said second output terminal of each of said at least two transistors being connected to a second circuit node, wherein said first circuit node is conductively coupled to said ground node, said at least two switching transistors to receive said digital input signal at corresponding input terminals thereof and to controllably couple said first and second circuit nodes in response to said digital input signal; and
      at least one cancellation transistor having an input terminal and first and second output terminals, said first and second output terminals of said at least one cancellation transistor being shorted together, said first output terminal of said at least one cancellation transistor being connected to said second circuit node and said second output terminal of said at least one cancellation transistor being connected to said output terminal of said driver circuit, said at least one cancellation transistor to receive an inverted version of said digital input signal at said input terminal of said at least one cancellation transistor;
   wherein said at least two switching transistors and said at least one cancellation transistor are each approximately the same size.

2. The driver circuit claimed in claim 1, wherein:
   said at least two switching transistors and said at least one cancellation transistor are matched devices.

3. The driver circuit claimed in claim 1, wherein:
   said at least one cancellation transistor includes N transistors and said at least two switching transistors includes 2N transistors, where N is a positive integer.

4. The driver circuit claimed in claim 1, comprising:
   at least one other cancellation transistor having an input terminal and first and second output terminals, said first and second output terminals of said at least one other cancellation transistor being shorted together, said second output terminal of said at least one other cancellation transistor being connected to said first circuit node and said first output terminal of said at least one other cancellation transistor being conductively coupled to said ground node, said at least one other cancellation transistor to receive an inverted version of said digital input signal at said input terminal of said at least one other cancellation transistor.

5. A driver circuit to drive a differential transmission medium, comprising:
   first and second differential output terminals to connect said driver circuit to first and second differential output lines, respectively;
   a current source connected between a common node and a ground node;
   a first switch circuit to controllably couple said first differential output terminal to said common node in response to a digital input signal, said first differential output terminal being held at a supply voltage when not coupled to said common node by said first switch circuit, said first switch circuit including:
      at least two first switching transistors each having an input terminal and first and second output terminals, said first output terminal of each of said at least two first switching transistors being connected to a first circuit node and said second output terminal of each of said at least two first switching transistors being connected to a second circuit node, wherein said first circuit node is conductively coupled to said common node, said at least two first switching transistors to receive said digital input signal at corresponding input terminals thereof and to controllably couple said first and second circuit nodes in response thereto; and
      at least one first cancellation transistor having an input terminal and first and second output terminals, said first and second output terminals of said at least one first cancellation transistor being shorted together, said first output terminal of said at least one first cancellation transistor being connected to said second circuit node and said second output terminal of said at least one first cancellation transistor being connected to said first differential output terminal of said driver circuit, said at least one first cancellation transistor to receive an inverted version of said digital input signal at said input terminal of said at least one cancellation transistor;

wherein said at least two first switching transistors and said at least one first cancellation transistor are each approximately the same size; and a second switch circuit, connected to said second differential output terminal, to controllably couple said second differential output terminal to said common node in response to an inverted version of said digital input signal, said second differential output terminal being held at said supply voltage when not coupled to said common node by said second switch circuit.

6. The driver circuit claimed in claim 5 wherein:

said second switch circuit includes:

at least two second switching transistors each having an input terminal and first and second output terminals, said first output terminal of each of said at least two second switching transistors being connected to a third circuit node and said second output terminal of each of said at least two second switching transistors being connected to a fourth circuit node, wherein said third circuit node is conductively coupled to said common node, said at least two first switching transistors to receive said inverted version of said digital input signal at corresponding input terminals thereof and to controllably couple said third and fourth circuit nodes in response thereto; and at least one second cancellation transistor having an input terminal and first and second output terminals, said first and second output terminals of said at least one second cancellation transistor being shorted together, said first output terminal of said at least one second cancellation transistor being connected to said fourth circuit node and said second output terminal of said at least one second cancellation transistor being connected to said second differential output terminal of said driver circuit, said at least one second cancellation transistor to receive said digital input signal at said input terminal of said at least one second cancellation transistor;

wherein said at least two second switching transistors and said at least one second cancellation transistor are each approximately the same size.

7. The driver circuit claimed in claim 6, wherein:

said at least two first switching transistors, said at least two second switching transistors, said at least one first cancellation transistor, and said at least one second cancellation transistor are each approximately the same size.

8. The driver circuit claimed in claim 6, wherein:

said at least two first switching transistors, said at least two second switching transistors, said at least one first cancellation transistor, and said at least one second cancellation transistor are matched devices.

9. The driver circuit claimed in claim 6, wherein:

said at least two first switching transistors, said at least two second switching transistors, said at least one first cancellation transistor, and said at least one second cancellation transistor are N-channel IGFET devices.

10. The driver circuit claimed in claim 5, wherein:

said at least one first cancellation transistor includes N transistors and said at least two first switching transistors includes 2N transistors, where N is a positive integer.

* * * * *